(12) United States Patent
Tsironis (10) Patent No.: US 11,506,708 B1
(45) Date of Patent: Nov. 22, 2022

(54) ON-WAFER TUNER SYSTEM AND METHOD

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/102,936

(22) Filed: Nov. 24, 2020

(51) Int. Cl.
*G01R 31/28* (2006.01)
*H03J 1/06* (2006.01)
*H03H 7/40* (2006.01)

(52) U.S. Cl.
CPC ..... *G01R 31/2893* (2013.01); *G01R 31/2831* (2013.01); *H03H 7/40* (2013.01); *H03J 1/06* (2013.01)

(58) Field of Classification Search
CPC .. G01R 31/2893; G01R 31/2831; H03H 7/40; H03J 1/06
USPC .......................................... 324/324, 637–646
See application file for complete search history.

(56) References Cited

U.S. PATENT DOCUMENTS

| | | |
|---|---|---|
| 7,102,457 B1 | 9/2006 | Tsironis |
| 7,135,941 B1 | 11/2006 | Tsironis |
| 9,431,999 B1 | 8/2016 | Tsironis |

OTHER PUBLICATIONS

"Computer Controlled Microwave Tuner, CCMT", Product Note 41, Focus Microwaves Inc. 1998.
BlueDial Bluetooth Dial Indicator, Mitutoyo indicator, model BD10-793 Datasheet [online], Motionics LLC [retrieved on Nov. 9, 2020]. Retrieved from Internet <URL: https://www.motionics.com/downloads/BlueDial.pdf>.
High Performance Probe Stations [online], Cascade Microtech [retrieved on Nov. 9, 2020]. Retrieved from Internet <URL:https://www.cascademicrotech.com/products/probe-systems/dedicatedsystems/vacuum-probe-systems>.
What is a Vector Network Analyzer and how does it work? [online], Tektronix [retrieved on Jun. 10, 2020] Retrieved from Internet <URL: https://www.tek.com/document/primer/what-vector-network-analyzer-and-how-does-it-work>.

*Primary Examiner* — Jermele M Hollington
*Assistant Examiner* — Courtney G McDonnough (57) ABSTRACT

A balanced on-wafer load pull tuner system includes an intelligent, independent and universal mechanical balancing and contact controlling device, supporting automatic microwave single or multi-probe slide screw tuners. It allows contacting and stable on-wafer testing of sub-micrometric devices. Ultra-low loss rigid airlines (bend-lines) used to connect the tuner with the semiconductor chips, in order to improve the tuning range at the DUT reference plane, transfer mechanical movements of the wafer probes attached to the rigid bend-lines, when the tuner mobile carriages move horizontally. A precisely controlled counter-weight allows contacting the DUT and balanced load pull operation by controlling the center of gravity of the assembly.

8 Claims, 13 Drawing Sheets

ON-WAFER TUNER SYSTEM AND METHOD

PRIORITY CLAIM

Not Applicable

CROSS-REFERENCE TO RELATED ARTICLES

1. TSIRONIS, C. U.S. Pat. No. 7,102,457, "Mechanically balanced microwave load pull tuner".
2. "Computer Controlled Microwave Tuner—CCMT", Product Note 41, Focus Microwaves Inc., January 1998.
3. TSIRONIS, C. U.S. Pat. No. 9,431,999, "Intelligent mechanical balancing apparatus for slide screw tuners".
4. BlueDial Bluetooth Dial Indicator, Mitutoyo indicator, model BD10-793 Datasheet [online], Motionics LLC [retrieved on Nov. 9, 2020]. Retrieved from Internet <URL: https://www.motionics.com/downloads/BlueDial.pdf>.
5. TSIRONIS, C. U.S. Pat. No. 7,135,941, "Triple probe slide screw tuner and method".
6. High Performance Probe Stations [online], Cascade Microtech [retrieved on Nov. 9, 2020]. Retrieved from Internet <URL:https://www.cascademicrotech.com/products/probe-systems/dedicatedsystems/vacuum-probe-systems>
7. What is a Vector Network Analyzer and how does it work?" [online], Tektronix [retrieved on Jun. 10, 2020] Retrieved from Internet <URL: https://www.tek.com/document/primer/what-vector-network-analyzer-and-how-does-it-work>.

BACKGROUND OF THE INVENTION

Figure 1:
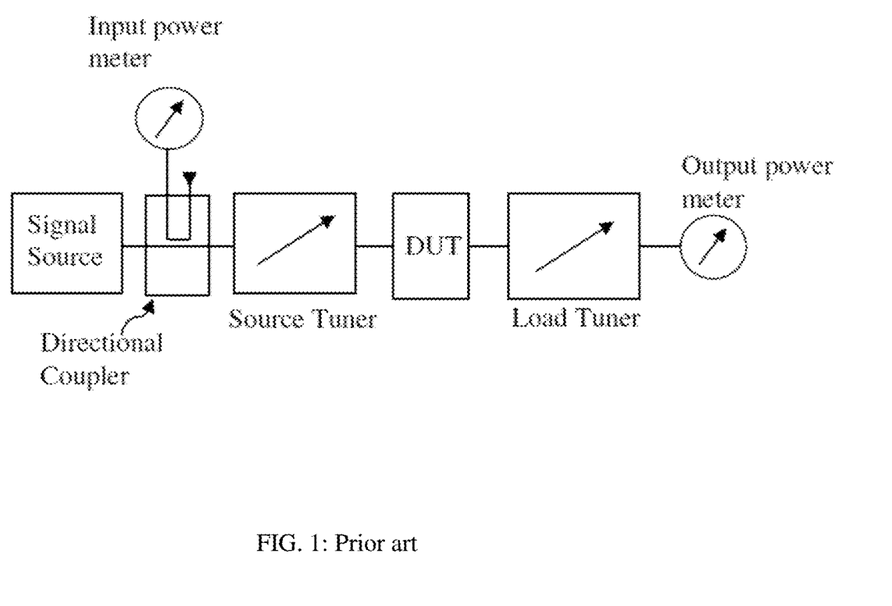
FIG. 1 depicts prior art, a block diagram of a load pull measurement setup, in which electro-mechanical impedance tuners are used to manipulate the source and load impedances presented to the DUT.

This invention relates to on-wafer load pull or source pull measurement setups, allowing controlling and eliminating the mechanical tilting caused by the electro-mechanical microwave tuners used in these setups, by adding a remotely controlled balancing counter-weight on the mechanism supporting and positioning the tuner (FIG. 1).

"Source pull" and "load pull" are test methods used in generating data used in designing high-power and low noise microwave amplifiers for various telecommunication systems. These measurement techniques employ microwave tuners and other microwave test equipment. The microwave tuners are used in order to manipulate the microwave impedance conditions under which the Device Under Test (DUT, or transistor) is tested (FIG. 2).

A basic load pull measurement system (FIG. 1) includes a signal source, a source tuner, a test fixture housing the DUT, a load tuner and an output power meter. The tuners and the overall test system are controlled by a control computer. Through digital commands from the computer the tuner's motors position the tuner's metallic tuning probes appropriately and create impedances, which allow characterizing the DUT (see ref. 1).

Figure 2:
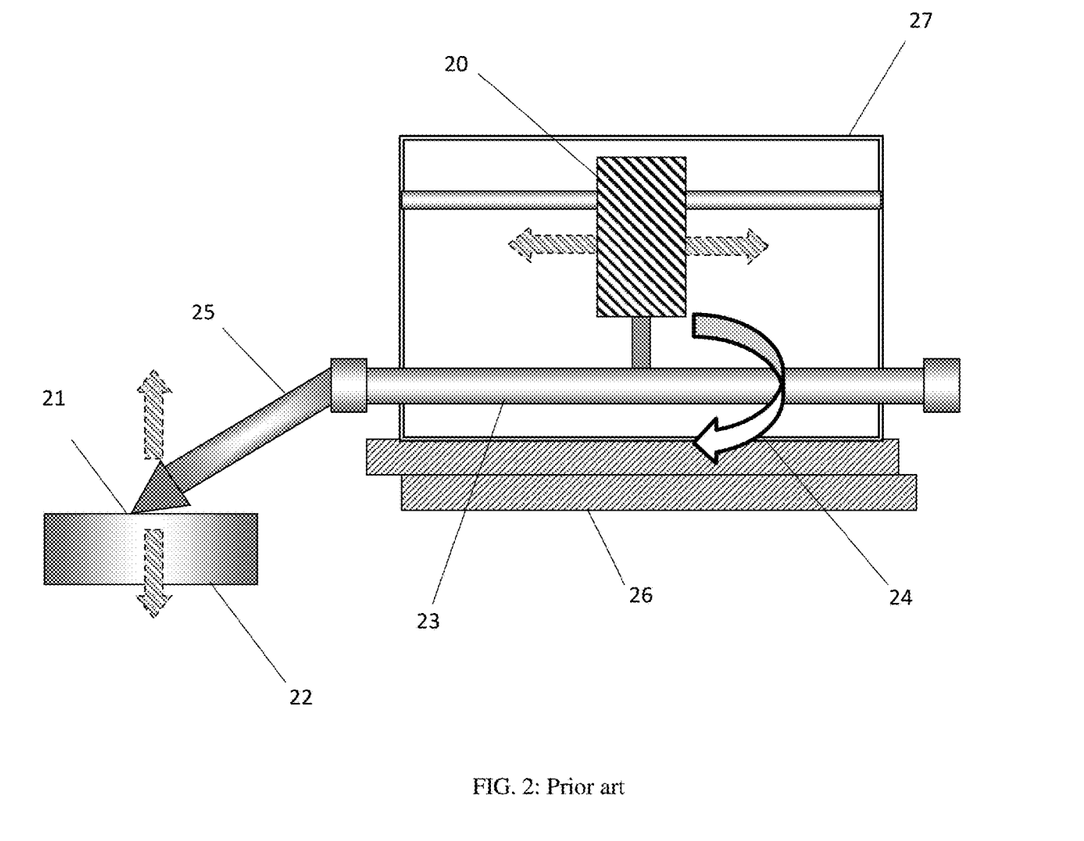
FIG. 2 depicts prior art, a front view and cross section of an automatic microwave tuner, assembled and mounted for on-wafer testing.

Electro-mechanical slide screw tuners include a solid housing (box) 27, FIG. 2, a low loss transmission media 23 for microwave energy (slotted transmission airline or slabline) with a test port attached to a rigid extremely low loss bent airline 25, a moving carriage 20 holding the microwave tuning probe and electrical stepper motors ensuring the horizontal and vertical movement of the carriage and the insertion of the tuning probe into the slabline slot. The tuner is placed on a tuner positioner 26, which has bearings or gliders allowing a 3-axis geometrical movement (X-Y-Z). The carriage 20 holding the probe comprises a housing, a precision vertical axis and gear and a vertical stepper motor; this makes such carriages 20 massive items with a typical mass of around 1 kg.

The low loss bent airline 25 forms an extension to the tuner slabline and is used to maximize the tuning range of the tuners; the bent airlines are either externally attached airlines or simply the seamless continuation of the slabline beyond the tuner housing and are connected directly to the wafer probes; they create a rigid mechanical link between the tuners and the wafer micro-probes 21 (FIG. 2). Any mechanical movement inside the tuners, especially tilting 24, caused by the horizontal movement of the tuner carriage(s), is translated on to the wafer probes 21 and creates a vertical wafer probe movement of, typically, several dozens of micrometers. Microchip contact pads on a wafer 22 being 100 µm to 200 µm square, even a small mechanical movement of the wafer probes may create loss of contact and/or damage.

Figure 3:
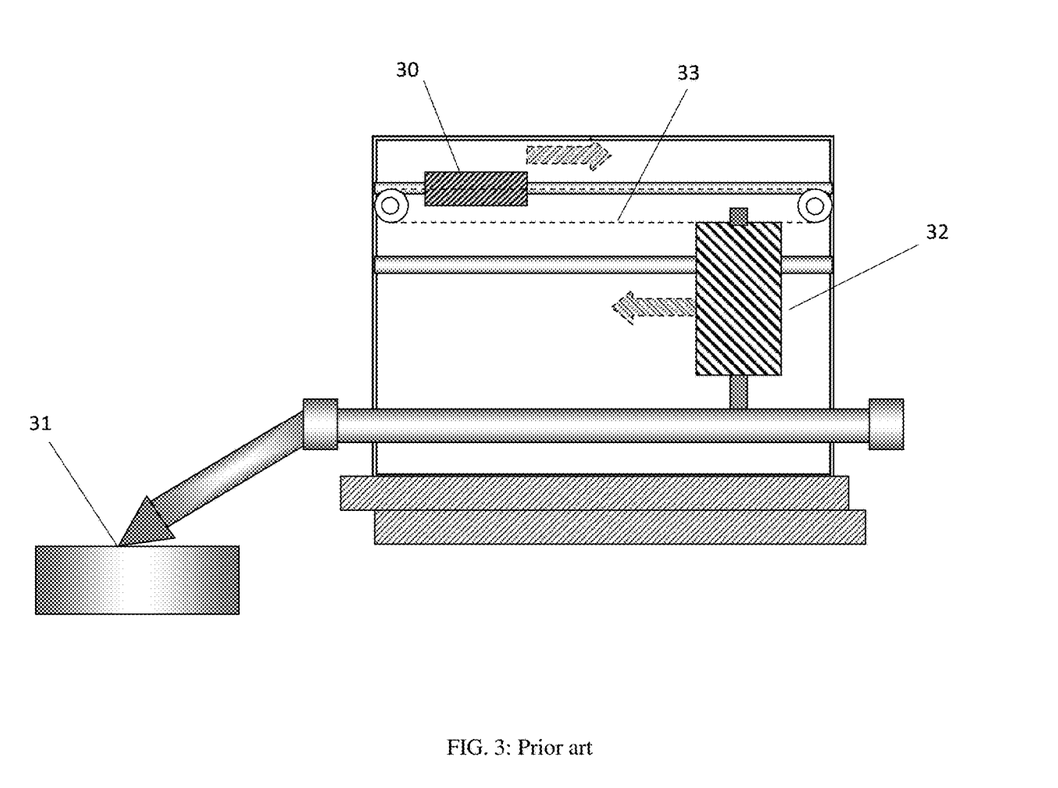
FIG. 3 depicts prior art, an automatic microwave tuner auto-balanced for vertical tilting, using a mobile counter-weight, placed inside the tuner enclosure and synchronized mechanically with the movement of the carriage.

The tilting problem and vertical movement of the wafer probes 31 has been addressed before using a mechanically coupled counter weight 30 (FIG. 3), which moves synchronous and opposite to the carriage 32 (see ref. 1). The problem with this, mechanically simple, solution is that the counter-weight 30 must have the exact same mass as the carriage 32 within a fraction of one gram and that the belt 33 linking both moving masses tends to be unreliable and unprecise over longer distances.

The contacting of the wafer probes with the DUT pads is done either using sophisticated automatic wafer probe stations (see ref. 6) or by adjusting each time manually the Z axis of the 3-axis positioner under careful observation under the microscope, a not securely reproducible operation in itself.

It is the purpose of this invention to solve both the tilting-balancing problem and automate the contacting process of the wafer probes with the DUT pads, using an intelligent automated mechanism.

BRIEF SUMMARY OF THE INVENTION

The problem referred to in 'BACKGROUND OF THE INVENTION', is solved by introducing, outside of the tuner housing (box) 27, an independently controllable mobile compact and mechanically simple counter-weight mechanism, moving synchronous and opposite to the movements of the carriages inside the tuner, in order a) to maintain the balance of the system by keeping the center of gravity of the assembly "tuner positioner & tuner & tuning probes" constant and b) to control the elevation of the wafer probes themselves to create an automated, repeatable electrical contacting of the wafer probe(s) with the DUT pads. The built-in capacity of independent control and movement of the counter-weight offers the major advantage that the counter-weight mass and the mobile carriage mass should be similar but not identical, as in other purely mechanical solutions, because independent remote control allows changing the momentum M=L*W (length times weight) by adjusting L at will.

To build this assembly, a thin large disc, with belt teeth cut on its on its periphery, forming a timing belt pulley of large diameter, carries a properly dimensioned counter-weight on its edge, is attached to the tuner positioner and is independently rotated by a remotely controlled stepper motor, which is mounted, preferably, on the tuner housing, for reasons of economy of space, or on the tuner support block. An overall balancing control procedure determines the rotation angles (corresponding to the controlling motor steps) of the disc relative to the tuner carriage movement for balancing the system and any desired elevation of the wafer probe by controlled unbalancing the system, and determines the rotation angle of the disc in two steps: a) balancing the carriage movement and b) making or breaking contact of the wafer probe with the microchip DUT pads on wafer.

BRIEF DESCRIPTION OF THE DRAWINGS

The invention and its mode of operation will be better understood from the following detailed description, when read with the appended drawings in which:

FIG. 12A through 12B depict flowchart of contacting protocol.

DETAILED DESCRIPTION OF THE INVENTION

The concept of a mechanically controlled balancing counter-weight is well established in moving mechanical constructions, like cranes etc., which are not allowed to tilt and, eventually, fall. The balancing counter-weight has to move synchronically and in opposite direction with the load, in order to keep the center of gravity of the whole structure constant. This concept has been used, in a purely mechanical version, in impedance tuners in prior art (see ref. 1) and in an intelligent, computer-controlled version as well (see ref. 3).

Figure 4:
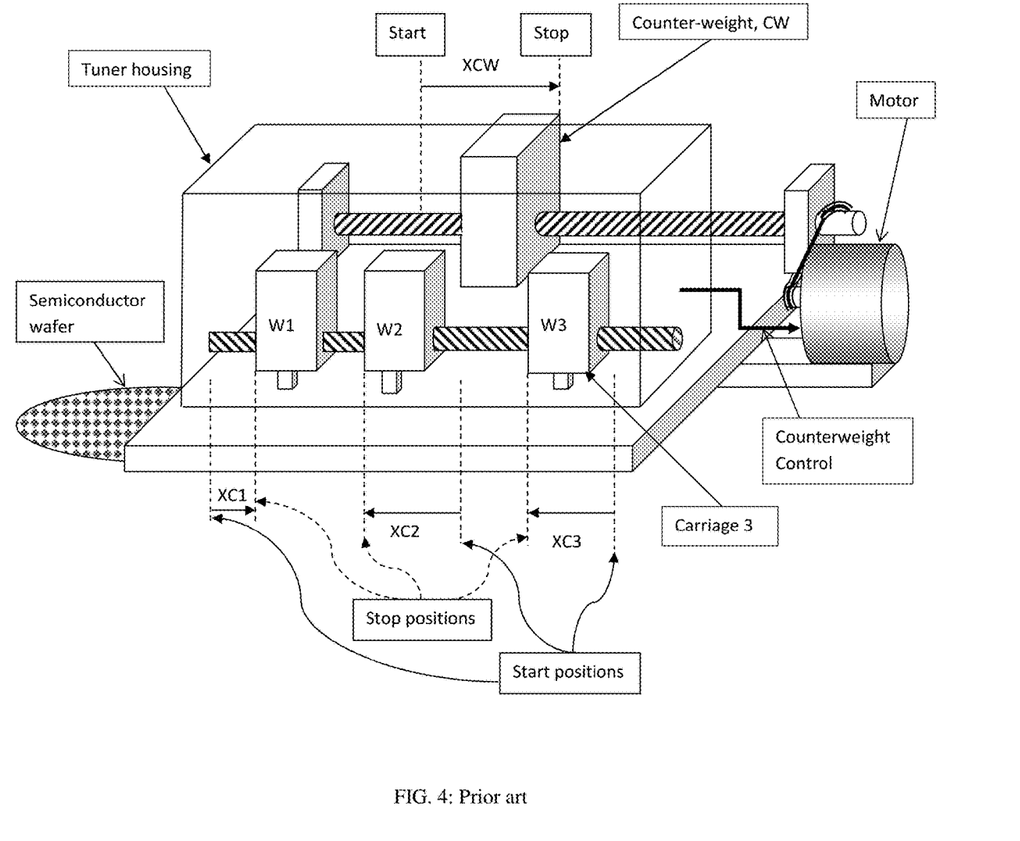
FIG. 4 depicts prior art, perspective view of a three-carriage tuner mounted on the tuner positioner and the associated relative carriage movements whose tilting force is compensated by the independently moving counter-weight.

The major advantage of the intelligent version of the balancing kit is the fact that the counter-weight does not have to have the exact same mass as the moving carriage, but also the fact that a numeric algorithm can balance more than one, independently moving, carriages (see ref. 2 and FIG. 4). Nonetheless, the prior art structure of FIG. 4 includes a separate horizontal control mechanism equivalent to the horizontal carriage control and is usually integrated into the tuner housing requiring a tuner re-design.

Impedance tuning occurs in two steps: in a first step the control computer calculates, in memory, using previously generated tuner calibration data (top section of FIG. 9), the required horizontal and vertical tuning probe positions in order to create the target impedance. So, before anything moves the controller "knows" where the probe(s) stand and where they must go. Vertical probe movement is here irrelevant, because the probes have small weight (<50 grams) and move very little (1-3 mm), which means it does not change the center of gravity of the tuner noticeably. Horizontal movement, however, does matter, because the carriages are heavy (>1 kg) and move long distances (several cm) and do modify the center of gravity. Therefore, the controller must control both the horizontal carriage motor(s) and the counter-weight motor to move opposite to keep the center of gravity CG constant at all times. In the case of a single carriage this can be done by simple mechanical means (see ref. 1 and FIG. 3). But when two or more carriages move (FIG. 4) then the counter weight must be close to the sum of the totality of the carriages and it must move opposite and by a proportionally corrected amount, corresponding to the "net" carriage movement. Therefore, the counter-weight mass shall be similar (not equal) to the totality of the mass of the carriage(s). This prior art philosophy is applied to the present invention as well.

Figure 9:
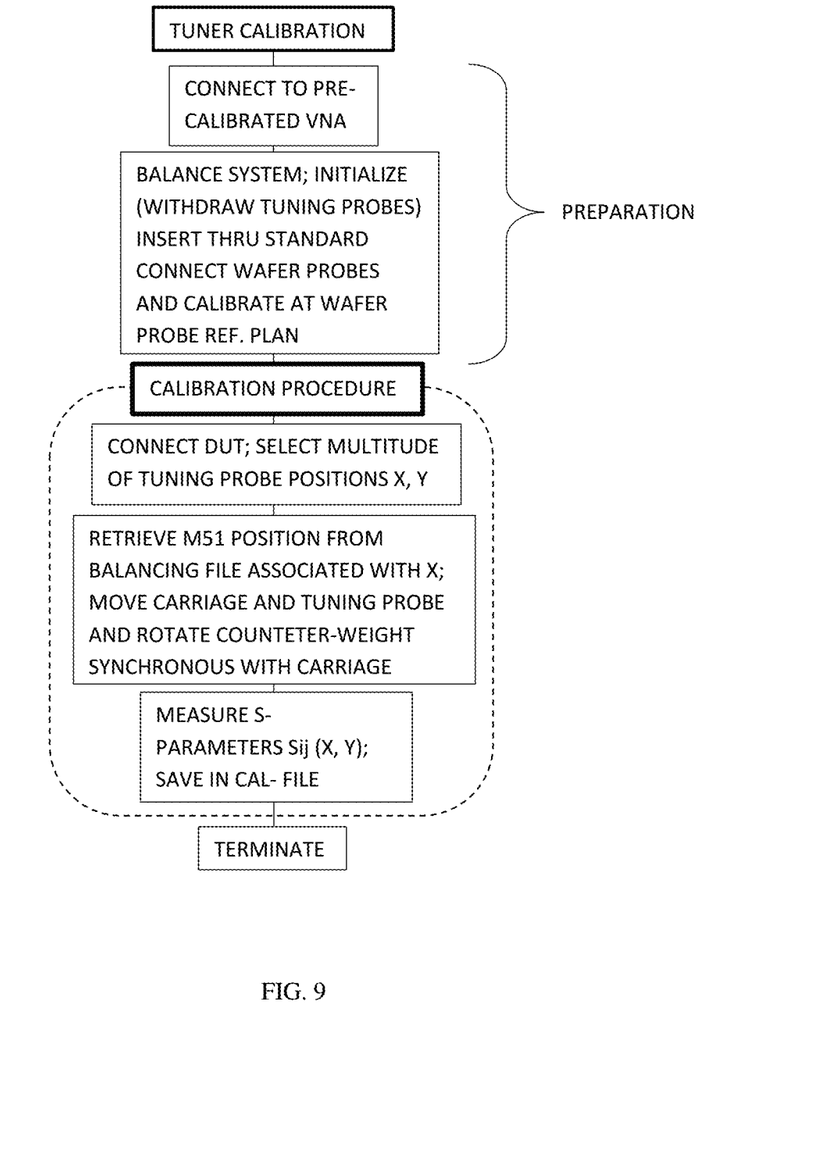
FIG. 9 depicts the flowchart of the tuner calibration procedure.

The controller, knowing the future movements of every carriage, can now anticipate the total algebraic movement of all moving carriages from the present to the next position (any carriage can move left or right independently of each-other), and can move the counter-weight in a way to compensate for this movement of the overall center of gravity, not of each carriage individually, even if this could also be done (bottom part of FIG. 9). The balancing apparatus is agnostic as per the number of carriages. The only thing that matters is the movement correction factor MCF (equal to the ratio of the mass of one carriage to the mass of the counter-weight) of each carriage and the associated carriage movement. This can be done "one carriage at a time", or simultaneously for all carriages. What is important is that the movement of the center of gravity is compensated by the movement of the counter-weight simultaneously. In the prior art case of FIG. 4 this is done by simple arithmetic. In the present case the rotating weight 57 changes its distance LW from the rotation point CG following a trigonometric function, that can be either calculated numerically or interpolated based on previous balancing calibration. The same is valid concerning the wafer-probe elevation 60 ($\Delta H$) in FIG. 6. Notice: Throughout this disclosure tuning probe/carriage movements and positions or counter-weight rotation are expressed, when required, in X, Y, $\Phi$ or equivalent stepper motor steps M51 or MC. The benefit of this is that it is generic to all tuner and gear configurations.

Figure 6:
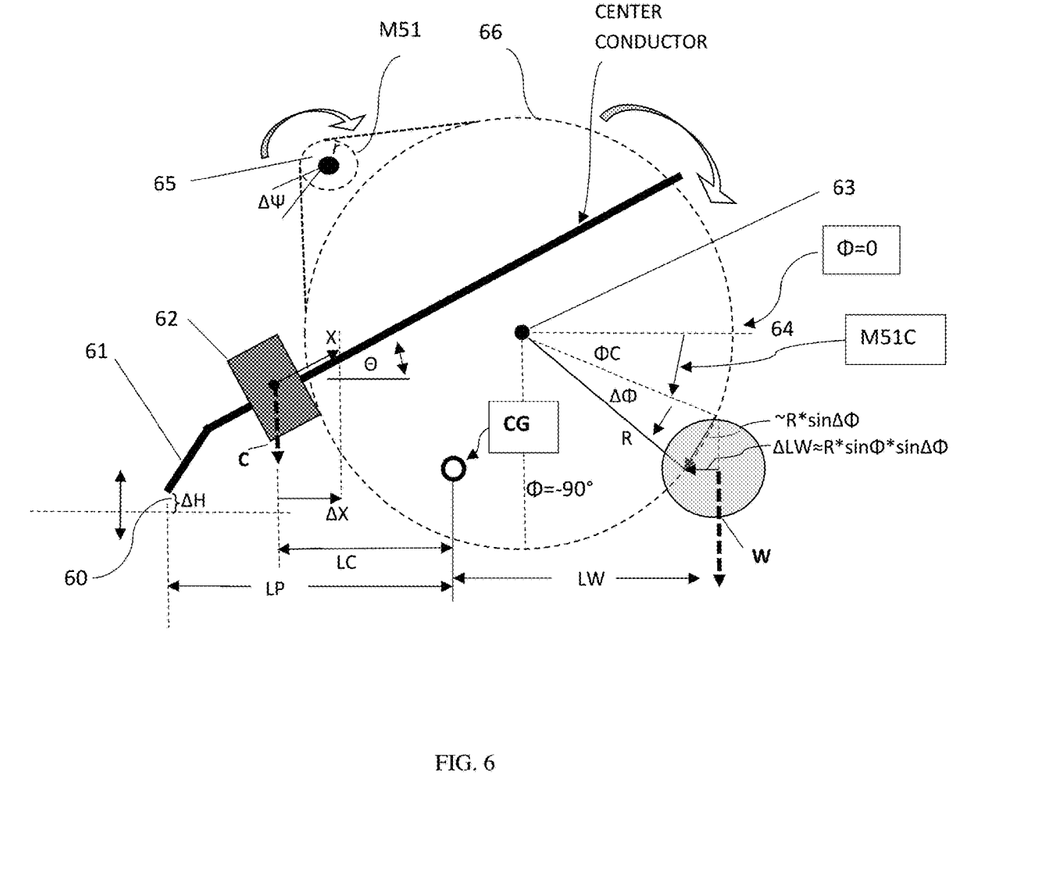
FIG. 6 depicts the geometrical relations of the balancing and contacting mechanism.

The following equations describe, approximately, the relation between the physical properties of the balancing mechanism, as shown in FIG. 6:

I. $C*\Delta X = W*\Delta LW \approx W*R*\sin \Phi * \sin \Delta\Phi$ [C=carriage mass, W=counter-weight mass]

II. $\Delta\Phi \approx \arcsin [\Delta X*C/(R*W*\sin \Phi)]$

III. $\Delta X = X*\cos \Theta$

IV. $\Delta\Phi = \Delta\Psi*r/R$ [$\Delta\Psi$=step of stepper motor, typically 1.8°]

V. $\Delta H = W*LP/(C*LC)*\Delta LW$

VI. $M51 = R/r*\Phi(°)*0.5556$ (steps); [$\Delta\Psi=1.8°$, 200 steps/360°=0.5556].

Figure 5:
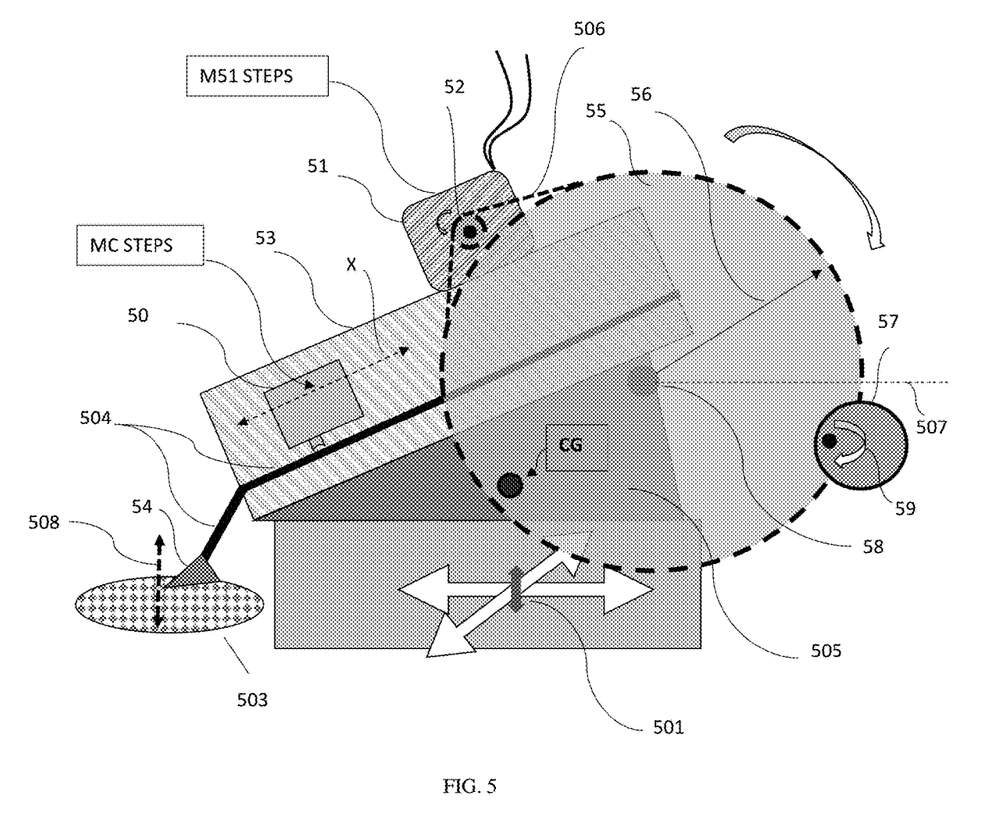
FIG. 5 depicts the balancing and contact control mechanism.

The mechanism is shown in FIG. 5 and the geometrical relationships and quantities used for the calculations in FIG. 6: The impedance tuner 53 includes the extended airline and center conductor 504, (also shown as item 25 in FIG. 2), which terminates with the wafer probe 54 touching the wafer 503 and the mobile carriage 50, which moves, remotely controlled by a (not shown, prior art, internal, stepper motor and associated control gear), along the "horizontal" portion of center conductor 504 inside the tuner housing 53. The steps of this internal stepper motor are referred to as MC and are numerically equal to the movement coordinate X. This movement shifts the center of gravity CG of the assembly tuner 53 plus pyramidal support 505 and 3-axis positioner 501, such that the total tilts around the center of gravity CG and moves the wafer probe vertically 508. This movement can be reduced but cannot be fully eliminated even by the most sophisticated (and expensive) construction of a 3-axis positioner 501. Several such attempts to date have failed. An ambitious construction can reduce the tilting and vertical movement 508, but it cannot eliminate it. Any such attempt conflicts with the basic mechanical conflict of mobility versus stability, within tolerances, of course. Gross tolerances create the impression, for practical reasons, that such compromise is possible. But tight tolerances, such as the movement of microscopic wafer probes, touching even smaller and fragile contact pads of micro-chips on wafer do not allow this. The only realistic approach, is to compensate accurately the movement of the center of gravity using mobile counter-weights. This is being done here using the counter-weight 57, mounted on the periphery of a large disc 55, which is rotated around a, perpendicular to the block 505, axis 58 using a timing belt 506, by a separate stepper motor 51. The counterweight 57 is eccentrically rotating 59 at the edge of disc 55, thus allowing for extra fine manual pre-balancing. Motor 51 is mounted, preferably, on the tuner body 53 itself or on the tuner support block 505. The timing belt pulley 52, attached on the axis of motor 51 is at least ten times smaller (r/R) than the disc 55, which rotates around the axis 58 attached to the tuner support. This allows for the basic phase step $\Delta\Psi$ of a standard stepper motor 51 of 1.8°/step to be reduced to $\Delta\Phi=0.18°$/step, or less, at the level of disc 55, providing for the required movement resolution $\Delta LW \approx R*\sin \Phi*\sin \Delta\Phi$ (FIG. 6) Herein R is the radius 56 of the disc 55 and r is the radius of the small timing belt pulley on the axis of motor 51. This configuration offers the additional benefit of the holding torque of motor 51 to be multiplied by the same factor R/r transferred to the large disc 55. The tuner support 505 and 3-axis positioner body 501 rotate around the virtual axis CG (center of gravity) and allow for the necessary balancing and lifting for making or breaking the contact 508 The system is sensitive and requires exact calibration and control, but offers the possibility of remotely balancing the tuner movement and creating a reproducible wafer-probe contact mechanism.

Figure 10:
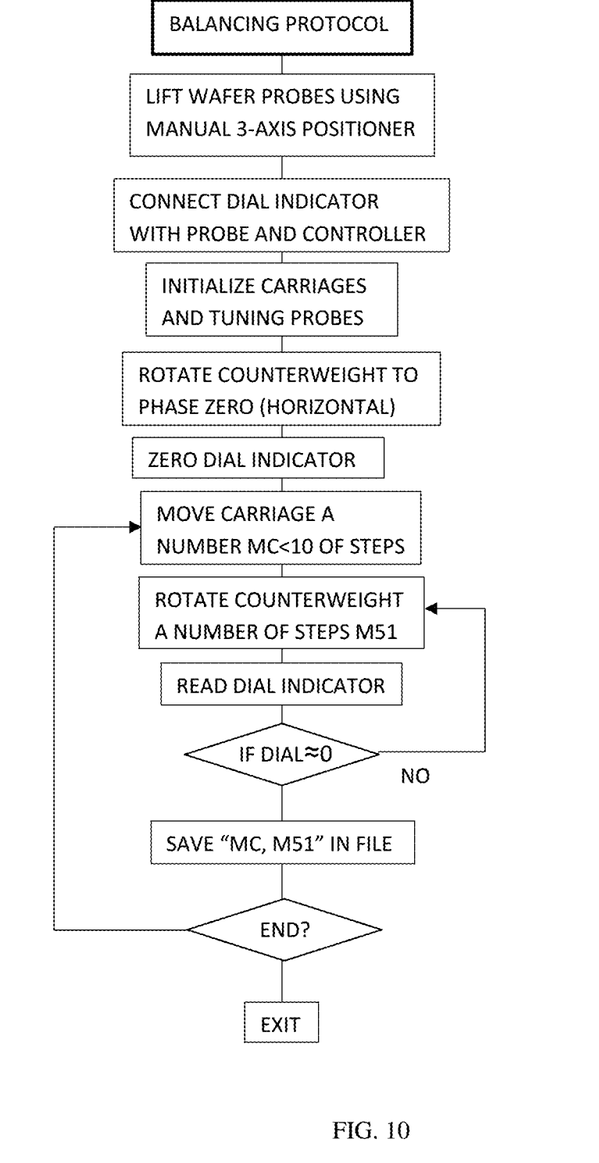
FIG. 10 depicts the flowchart of the balancing protocol.

When the disc 66 rotates around its center 63, the distance LW (FIG. 6) of the counter weight, having a mass W, to the center of gravity CG (=rotation point) of the assembly changes and establishes balance with the change $\Delta X$ of position X of the carriage 62 having a mass C, following the relation $\Delta X*C=W*\Delta LW \approx W*R*\sin \Phi*\sin \Delta\Phi=W*r/R*\sin \Phi*\sin \Delta\Psi$, wherein $\Delta\Psi=1.89$ step is the step size of timing belt pulley 65. The number of steps of motor 51 driving pulley 65 relates directly with the steps of the motor controlling the tuner carriage 62 times the cosine of the angle $\Theta$: cos $\Theta$. In prior art FIG. 3, $\Theta=0°$, thus cos $\Theta=1$, any move of the carriage 32 must be compensated by an equal counter move of the counter-weight 30. This, as far as the balancing of the assembly is concerned. The control of the wafer-probe elevation follows the same principle but with a different arm, i.e. the distance LP of the wafer-probe from the rotation axis CG. The elevation $\Delta H$ follows the relation: $\Delta H=W*LP/(C*LC)*\Delta LW$ and, using the previous equation: $\Delta H=W*LP/(C*LC)*r/R*R*\sin \Phi*\sin \Delta\Psi$ or we can assign every step of motor 51 (M51) to an elevation unit of the wafer-probe. Of course, because this solution uses only one counter-weight, this mechanical simplification must be compensated by a more sophisticated motor control, since any movement of the disc 55, will, not only lift or lower the wafer probe, but it will also destabilize the balancing. Therefore, the balancing-contacting process must include two processes, the balancing process and the contacting process, working in unison and resulting into a single motor 51 (M51) step count (FIG. 10). However, the balancing act must always be maintained, whether the wafer probes contact or not, and the contacting must be executed only when the carriage is not moving, preferably when the carriage(s) is (are) initialized (returned to horizontal X=0 position). Either operation instructs motor 51 to execute a number of steps, corresponding to balancing or contacting.

For best operation the contacting process shall be activated and defined when the carriage(s) 62 are initialized, closest to the test port (the port closest to the DUT). At this position the wafer probes are lifted and the counter weight is moved farthest away laterally from the rotating point CG (center of gravity); this defines the angle $\Phi=0$, 64; then the counter-weight W is rotated downwards (closer to CG) and this lowers the extended airline 61 and the attached wafer probe. Inspecting under microscope the contact status of the wafer probe on the chip pads, when considered safe, defines the contact angle FC and the associated motor 51 steps M51C which control timing belt pulley 65. This contacting configuration and number of steps M51C are valid only when carriage 62 is initialized. However, if the trigonometric relation between motor 51 steps and carriage motor steps is taken into account, then the contacting procedure can be executed at any position of the carriage(s). The distance LW to the center of gravity CG changes as a function of sin $\Phi$. This means, the closer the counter-weight is to the lowest position on the circle ($\Phi=-90°$), the higher the sensitivity and lower the resolution of the contacting process (FIG. 6).

As an example, let's assume typical values: C=1 kg, W=0.5 kg, LC=10 cm, LW=20 cm, LP=15 cm, r/R=0.05, R=20 cm and $\Phi=3°$. Then $\Delta H$ will be: 0.7 mm/step; at F=1° $\Delta H$ becomes 0.23 mm/step etc.

Figure 7:
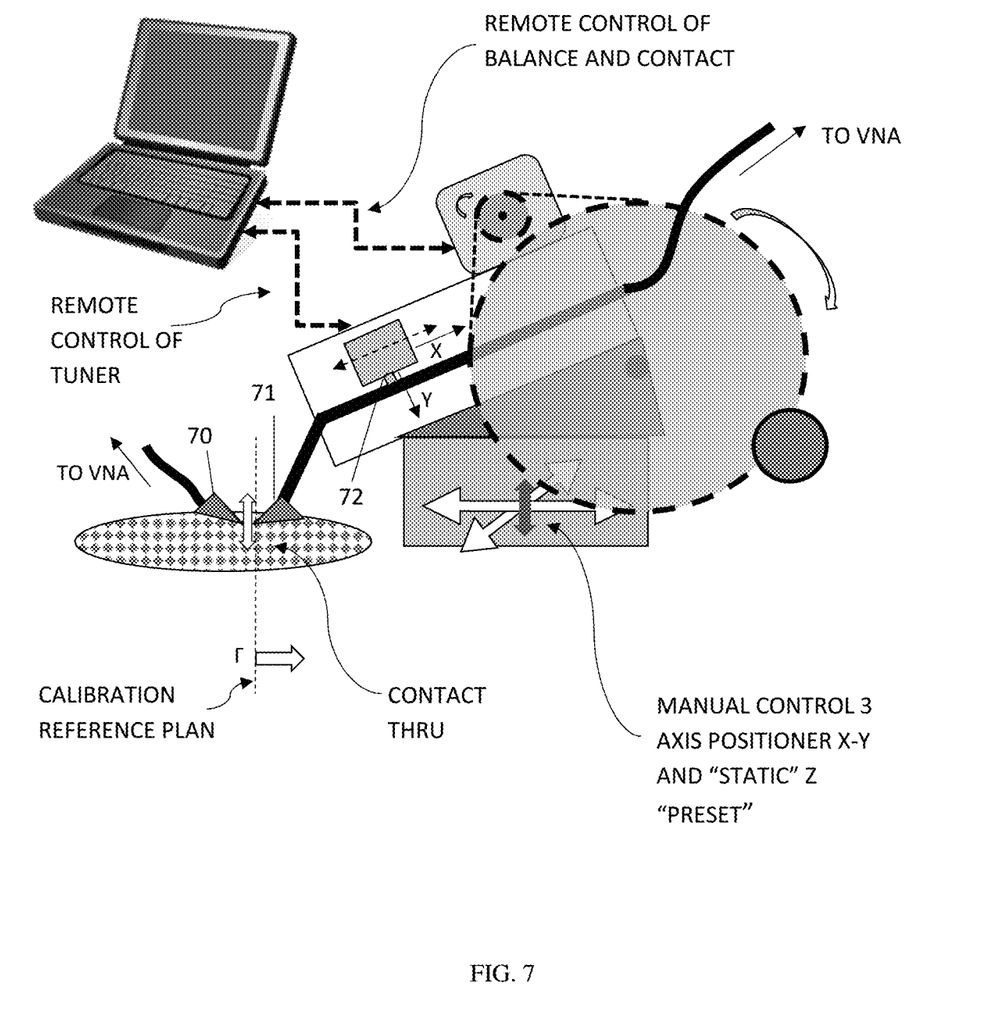
FIG. 7 depicts manual and remote control of the wafer test system.

The critical calibration procedure starts by calibrating the test setup on-wafer, using a pre-calibrated vector network analyzer (VNA) (see ref. 7) and inserting a THRU line chip standard between the input and output wafer probes (FIG. 7). After the wafer probes 70, 71 are lifted, the carriage stepper motor(s) are initialized. The carriage motor (inside the tuner housing 53 and not shown) is initialized, typically, by moving the carriage close to the test port (the one closest to the wafer probe, and DUT) until it hits an electric or optical limit switch. This creates the horizontal position X=0. Vertical movements of the tuning probe(s) 72 are ignored because their weight is small and the footprint of their vertical movement in horizontal direction is negligible. Assuming that the actual inclination of the assembly tuner-positioner-wafer probe is balanced (if not, the disc 55 is rotated by motor 51 and the heavy disc 57 is rotated 59 manually to get to this state), this defines the phase $\Phi=0$, (507) and the associated motor 51 count is set to M51=0. What is important for the overall design of the system is that the counter-weight 57 and the disc radius 56 must be able to counter for the movement of the carriage 50 between X=0 and X=λ/2 at the lowest frequency of the tuner operation, since this horizontal travel is required to cover 360° on the Smith chart. Subsequently the carriage is moved by a small number of steps in X direction and the disc 55, with the counter-weight 57 attached to it, is rotated using motor 51 to keep balance around the center of gravity CG, which is a virtual point, defined by the overall distribution of the masses of the components of the system. The system does not have a center of rotation defined by design, and remains therefore neutral to the positioner and tuners and their disposition, as long the choice of counter-weight mechanism can keep it balanced and the movement compensated by the counter-weight. This makes the solution generic.

Figure 8:
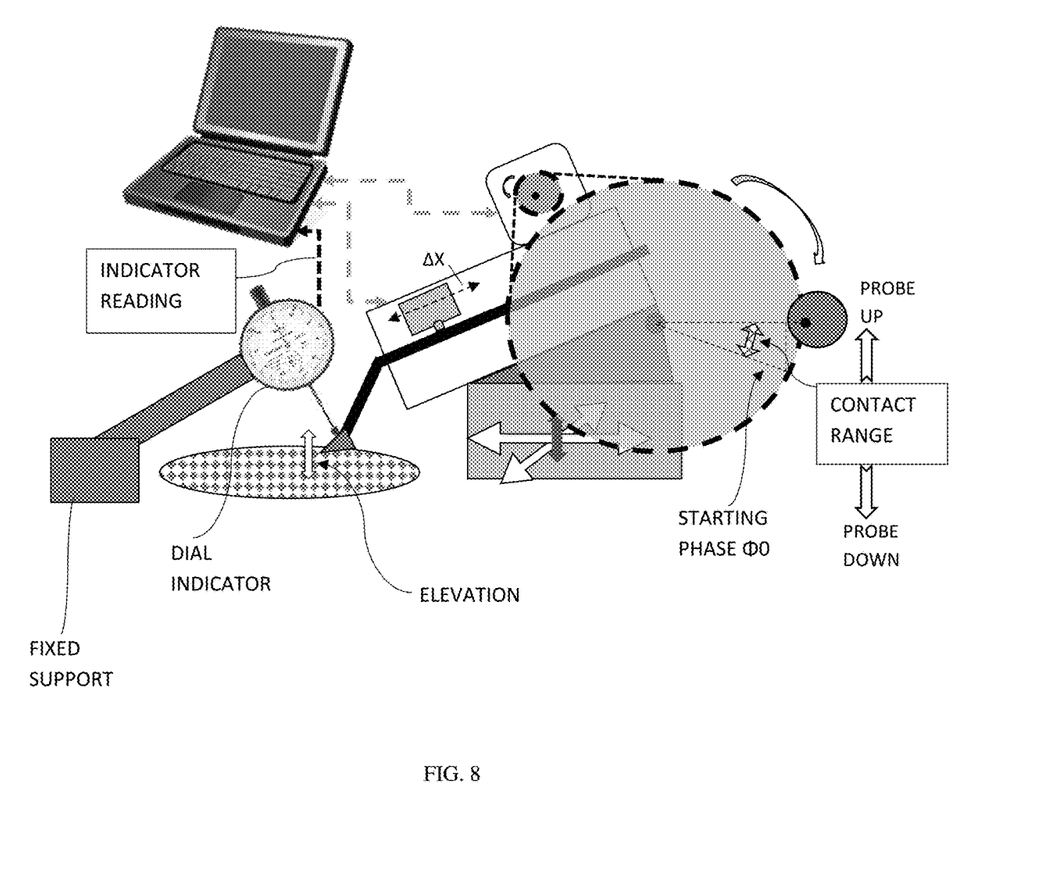
FIG. 8 depicts test setup for creating the balancing protocol.

Maintenance of the balance is controlled by a method called "Balancing Procedure" (FIG. 8). Herein a sensitive, remotely readable, dial indicator is used (see ref. 4) detecting level changes down to 1 μm. The setup is shown in FIG. 8. For every move ΔX (number of (not shown) carriage motor steps, MC), starting at MC=0 or X=0 of the carriage, the associated number of motor 51 (M51) steps, needed for balancing the system as shown by the indicator, are registered in a balancing calibration file for later use. That is, for every carriage position X (expressed in MC steps) we know the associated motor 51 steps M51, to keep the system balanced. Because of the trigonometric approximations it is impractical to use the equations. It is more accurate to use exact step-for-step calibration. The remotely controlled indicator of ref. 4 allows the process to be automated, using a control loop, in which the carriage motor moves a few steps horizontally and motor 51 moves back and forth until the indicator zeroes within a given tolerance (FIG. 8) and the associated motor steps are saved in the balancing file. Later on, at execution, the anchoring points in this datafile can be interpolated (FIG. 10).

Figure 12A:
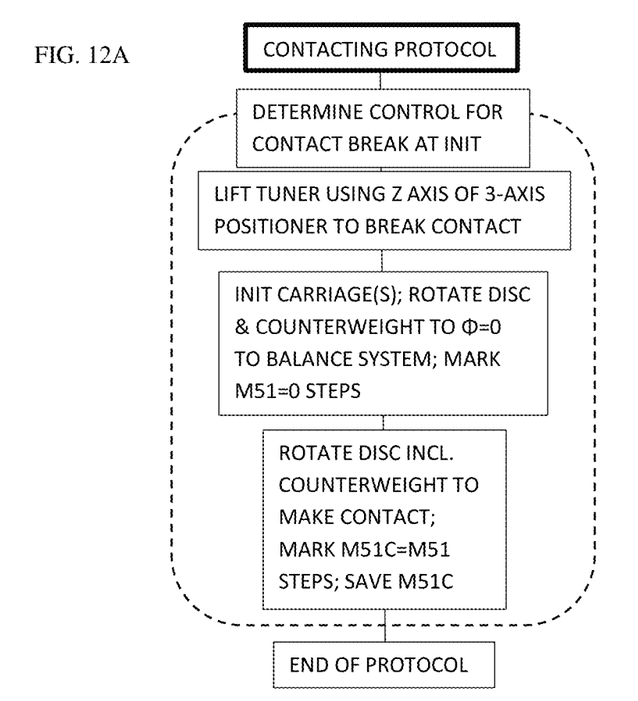
FIG. 12A depicts definition of contacting control steps.
Figure 12B:
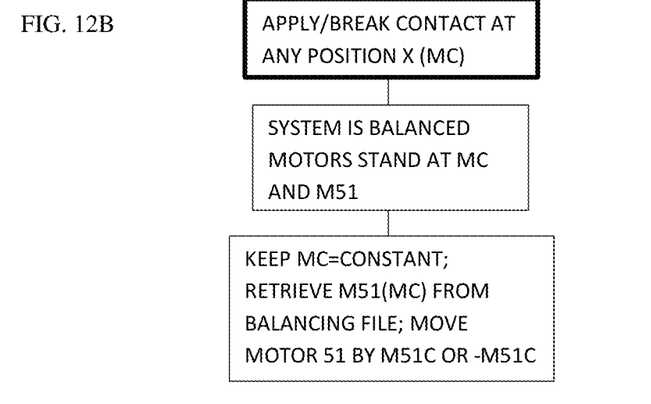
FIG. 12B depicts application of contacting protocol for making or breaking contact.
Figure 13:
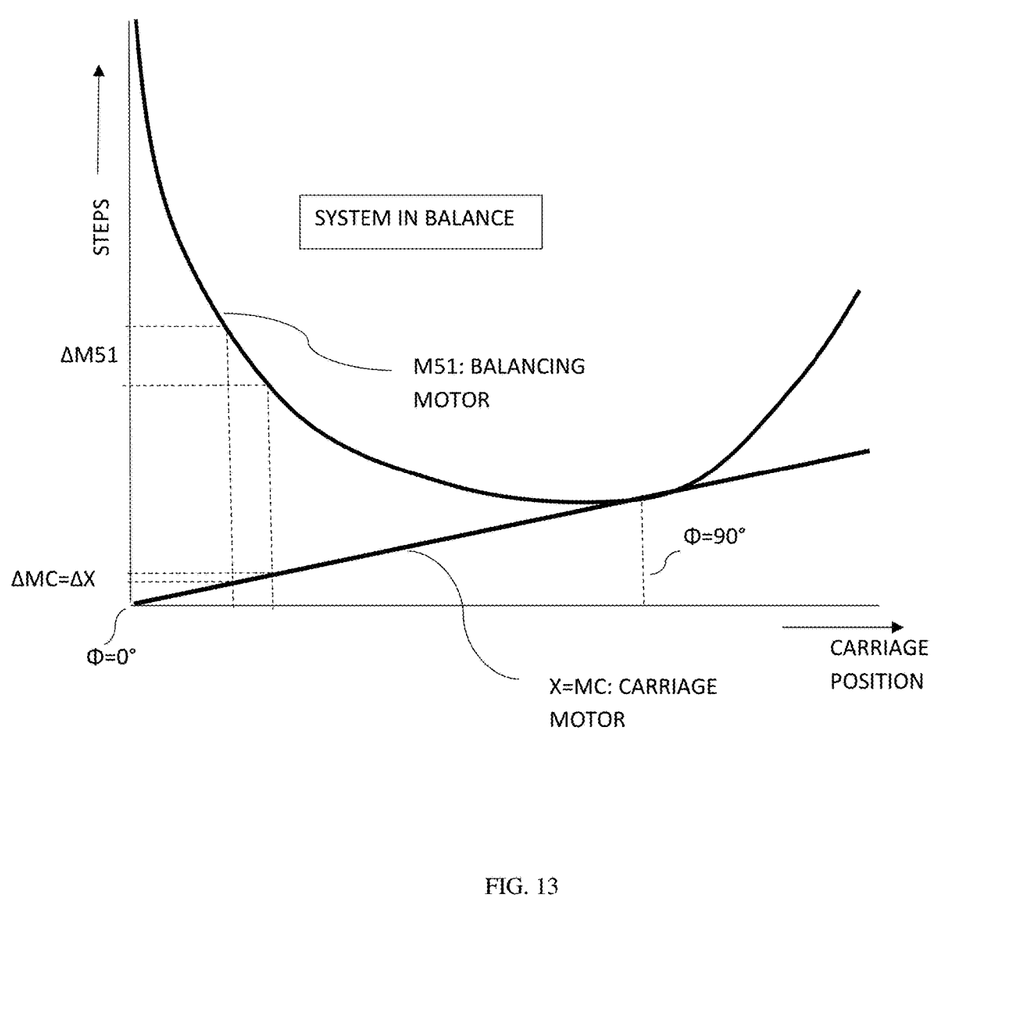
FIG. 13 depicts motor positions of balanced system as a function of carriage horizontal position.

The wafer probe contacting process (FIGS. 12A and 12B) works best at the balanced situation of initial position (X=MC=0) of the carriage(s) and the associated phase Φ=0 of the counter-weight (FIG. 6): the Z-axis of the 3-axis positioner is lifted to create a safe distance between wafer-probe and DUT pads (~2-3 mm); then the motor 51 is used to imbalance the assembly (by moving the counter-weight on an arc closer to the center of gravity (CG) and cause the wafer-probe to descend and make contact with the DUT pads. The wafer probe contact is verified under microscope and electrically by applying a small bias and verifying electrical continuity. The number of M51 steps of motor 51 is registered as M51C (C for contact) and can be applied at any time to break the contact and in opposite direction to re-establish it, as long as the carriage is initialized to the X=0 position. The important issue with the contacting process is that in this case only motor 51 moves, whereas the carriage motor stands immobile at zero. When the carriage is not initialized (X=MC>0) and the weight 57 is not at the maximum distance from the center of gravity CG (or Φ=0), the disc 55 must rotate differently to create the necessary shift in LW (FIG. 6) to lift the wafer-probe as in the case MC=X=0; this can be seen from FIG. 13; only when the weight moves quasi horizontally (Φ=−90°) then a change in LW (FIG. 6) corresponds to a change of carriage position projected on the horizontal X*cos Θ, wherein Θ is the (non-adjustable) angle of the slope of the tuner (FIG. 6). In summary, the wafer probes are lifted when the counter-weight moves by ΔLW=R*(1−cos ΦC)=R(1−cos(M51C*r/R*1.8°)), assuming the balancing motor 51 rotates at 1.8°/step. The exact number of steps M51X required for motor 51 to rotate the large disc 66 to lift the wafer-probe (break the contact) is best determined approximately numerically from the relation sin ΦX=(1−cos ΦC)/sin Φ, at any angle Φ=M51*r/R*1.8° yielding ΦX=arc-sin ((1−cos ΦC)/sin Φ))=M51X*r/R*1.8° or M51X=r/R*1.8° *arc-sin {((1−cos (M51C*r/R*1.8°/sin(M51*r/R*1.8°)}.

Figure 11:
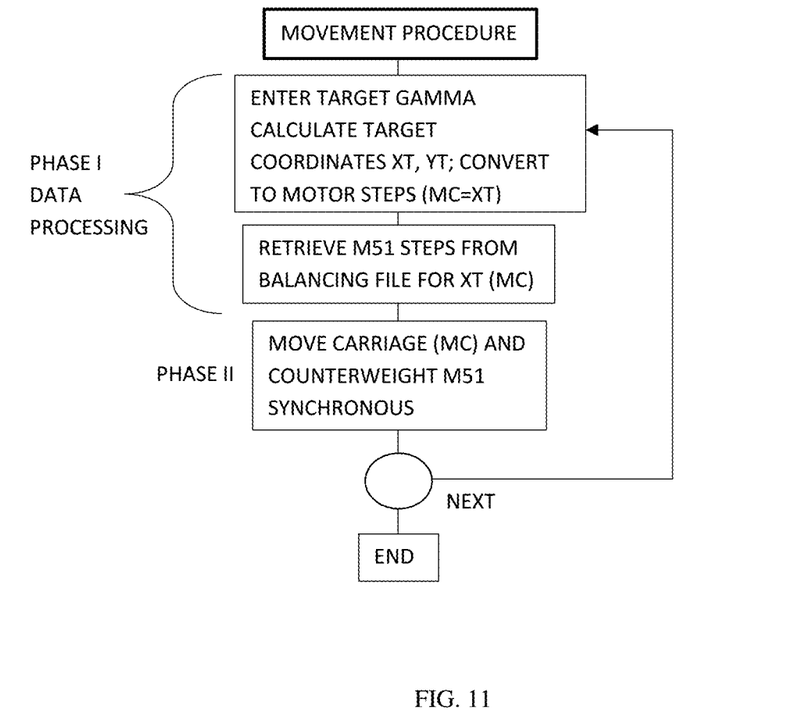
FIG. 11 depicts the movement procedure.

The actual measurement requires a precise movement procedure. This includes moving the tuning probe of the tuner and the counter-weight to balance the tilting. The flowchart of FIG. 11 shows the steps. They include two phases: Phase I includes all data processing and numeric calculations, starting for externally or internally defining the next impedance target point. Based on the new horizontal carriage target position, the algorithm retrieves the associated target state of the balance control motor 51 from the balance protocol file and then, in phase II, moves both motors, the internal carriage motor and the control motor 51, simultaneously, followed by any measurement actions. The process is repeated when the next impedance must be synthesized. In case more than a single tuner carriage is used, example harmonic multi-carriage tuners, see ref. 5, the horizontal movement is based on the instantaneous and final arithmetic sum of the movement of all carriages (see ref. 3), such that at any single instant the center of gravity CG of the system stays fixed. Vertical tuning probe movement is ignored.

A plausible question could arise, why use a small timing belt pulley 52 to rotate a large disc 55 to control the weight 57 and not simply attach the weight 57 to a rotating arm attached to balancing motor 51? The answer is twofold: 1) the resolution: Balancing motor 51 has a 1.8°/step resolution, whereas disc 55 has one tenth of this, or even less, depending on the ratio r/R, and 2) the effective holding torque for motor 51 which is multiplied tenfold or more by the factor R/r.

The wafer tuner test setup has been presented using a basic embodiment. It allows balancing the movement of the tuner carriage(s) and control the making and breaking of the probe contact with the DUT chip. Obvious alternatives shall not impede on the basic idea of controlling balancing and contacting using a single automatic control.

What is claimed is:

1. A balancing mechanism for an impedance tuner, which said tuner has at least one horizontally remotely movable carriage between X=0 and X=XMAX, is mounted on a wafer probe station and is directly connected to a wafer probe, said balancing mechanism comprising:
   a disc, a disc control pulley, a timing belt, a remotely controlled balancing stepper motor, a 3-axis tuner positioner with a tuner support block and a counter-weight mounted on the disc, wherein
   the disk has a radius R and timing belt-compatible teeth on its periphery and rotates around an axis perpendicular to the tuner support block, and wherein
   the balancing stepper motor controls the disc rotation using the disc control pulley, which has a radius r<<R, and the timing belt, and wherein
   the counter-weight is attached near the periphery of the disc.

2. The balancing mechanism for the impedance tuner as in claim 1, wherein the balancing stepper motor is mounted on the tuner.

3. The balancing mechanism for the impedance tuner as in claim 1, wherein the balancing stepper motor is mounted on the tuner support block.

4. A balancing procedure for the balancing mechanism for the impedance tuner as in claim 1, comprising the following steps:
- a) lift the tuner and the wafer probe using the 3-axis tuner positioner;
- b) connect a dial indicator mechanically with the wafer probe and electrically with a system controller;
- c) initialize the tuner;
- d) rotate the counter-weight at a phase Φ=0 and mark a setting of the balancing motor M=0;
- e) zero the dial indicator;
- f) move a tuner carriage to a position X≥0;
- g) rotate the balancing motor to M≥0 steps to minimize the dial indication;
- h) save X and M in a balancing file BF;
- i) continue with steps e) to i) as long as X does not exceed XMAX.

5. A calibration method of the impedance tuner as in claim 4, comprising
- (A) preparation steps and (B) tuner calibration steps, as follows:
- (A) the preparation steps comprise:
  - a) connect to a pre-calibrated vector network analyzer (VNA);
  - b) initialize the tuner;
  - c) apply the balancing procedure, connect the wafer probe to a THRU standard;
  - d) apply a TRL (through-reflect-line) method and calibrate at wafer probe reference plane;
  - e) connect the wafer probe to the THRU standard;
- (B) the tuner calibration steps comprise:
  - f) select a multitude of tuner states (MTS);
  - g) in a move-measure-save loop for the multitude of the MTS tuner states:
    - i) retrieve the counter-weight position M from the balancing file BF associated with a carriage position X;
    - ii) move the carriage and the counter-weight synchronous to the positions M and X;
    - iii) measure s-parameters of the tuner and save in a calibration file.

6. A remotely controlled wafer-probe contacting protocol for the impedance tuner as in claim 4 comprising the following steps:
- a) initialize the tuner;
- b) lift the tuner by a minimum amount required to break contact of the wafer probe;
- c) select a carriage position X≥0;
- d) retrieve X and M(X) from the file BF and rotate the balancing motor to balance the impedance tuner;
- e) move the tuner carriage to X;
- f) rotate the balancing motor to M=MC>0 to make safe contact of the wafer probe and save X and MC in a contacting file CF;
- g) continue with steps b) to g) as long as X≤XMAX.

7. A remotely controlled wafer-probe contact-breaking protocol for the impedance tuner as in claim 4 comprising the following steps:
- a) initialize the tuner;
- b) lower the tuner to establish safe contact of the wafer probe;
- c) select a carriage position X>0;
- d) retrieve X and M(X) from the file BF and rotate the balancing motor to balance the system;
- e) move the tuner carriage to X;
- f) rotate the balancing motor to M=MBC<0 to break the contact of the wafer probe and save X and MBC in a contact breaking file CBF;
- g) continue with steps b) to f) as long as X≤XMAX.

8. A balancing stepper motor for the balancing mechanism for the impedance tuner as in claim 1, wherein a motor step is 1.8°.

* * * * *